United States Patent
Kishima et al.

(10) Patent No.: US 9,917,452 B2
(45) Date of Patent: Mar. 13, 2018

(54) BATTERY CHARGER CAPABLE OF EFFICIENTLY COOLING SECONDARY BATTERY IN BATTERY PACK AND CHARGING CIRCUIT UNIT IN BATTERY CHARGER

(71) Applicant: HITACHI KOKI CO., LTD., Tokyo (JP)

(72) Inventors: Yuji Kishima, Hitachinaka (JP); Toshio Mizoguchi, Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 392 days.

(21) Appl. No.: 14/326,214

(22) Filed: Jul. 8, 2014

(65) Prior Publication Data
US 2015/0084591 A1 Mar. 26, 2015

(30) Foreign Application Priority Data

Jul. 12, 2013 (JP) ................................. 2013-146381

(51) Int. Cl.
*H02J 7/00* (2006.01)
*H05K 7/20* (2006.01)

(52) U.S. Cl.
CPC ............. *H02J 7/0042* (2013.01); *H02J 7/00* (2013.01); *H02J 7/0013* (2013.01); *H02J 7/0052* (2013.01); *H05K 7/20145* (2013.01)

(58) Field of Classification Search
CPC ............ H05K 7/20145; H05K 1/0201; H05K 1/0272; H05K 2201/064; H02J 7/0042; H02J 7/0052; H02J 7/0044
USPC ........................................ 320/107, 113, 115
See application file for complete search history.

(56) References Cited

U.S. PATENT DOCUMENTS

| 6,027,535 | A | * | 2/2000 | Eberle ................... | H02J 7/0042 361/690 |
| 6,066,938 | A | * | 5/2000 | Hyodo .................. | H02J 7/0042 320/114 |
| 2004/0207368 | A1 | * | 10/2004 | Kimoto ............... | H01M 2/1077 320/150 |
| 2005/0121979 | A1 | * | 6/2005 | Matsumoto ......... | H01M 10/441 307/66 |
| 2005/0196273 | A1 | | 9/2005 | Nishikawa et al. | |
| 2007/0236177 | A1 | | 10/2007 | Phillips et al. | |

(Continued)

FOREIGN PATENT DOCUMENTS

| CN | 1663749 A | 9/2005 |
| CN | 201084796 Y | 7/2008 |

(Continued)

OTHER PUBLICATIONS

Extended European Search Report for application EP14175905.0 (dated Sep. 16, 2014).

(Continued)

*Primary Examiner* — David V Henze-Gongola
(74) *Attorney, Agent, or Firm* — Kilpatrick Townsend & Stockton LLP

(57) ABSTRACT

A battery charger that is configured to charge a battery pack including a secondary battery includes: a housing; and a charging circuit unit disposed in the housing. The housing defines a first air passage in which air flows to cool the secondary battery and a second air passage in which air flows to cool the charging circuit unit. The second air passage is independent from the first air passage.

17 Claims, 9 Drawing Sheets

(56) References Cited

U.S. PATENT DOCUMENTS

2008/0290836 A1* 11/2008 Tsai .................. H02J 7/0042
320/114
2014/0340025 A1* 11/2014 Rief .................. H02J 7/0044
320/107

FOREIGN PATENT DOCUMENTS

| EP | 0793326 A1 | 9/1997 |
|---|---|---|
| GB | 2421370 A | 6/2006 |
| GB | 2471279 A | 12/2010 |
| GB | 2471370 A | 12/2010 |
| JP | 01-291638 A | 11/1989 |
| JP | 2003-143766 A | 5/2003 |
| JP | 2004-319232 A | 11/2004 |
| JP | 2011-200072 A | 10/2011 |

OTHER PUBLICATIONS

Japan Patent Office office action for JPO patent application 2013-146381 (dated Oct. 13, 2016).
European Patent Office Result of Consultation for patent application EP14175905.0 (dated Aug. 23, 2016).
China Intellectual Property Office office action for application 201410334077.2 dated Oct. 9, 2017, 21 pages with translation.

* cited by examiner

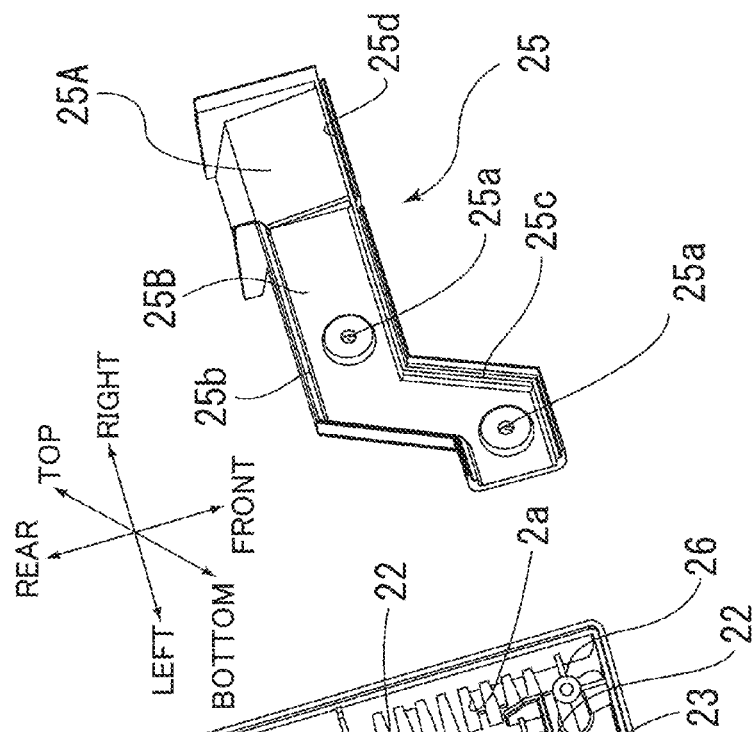
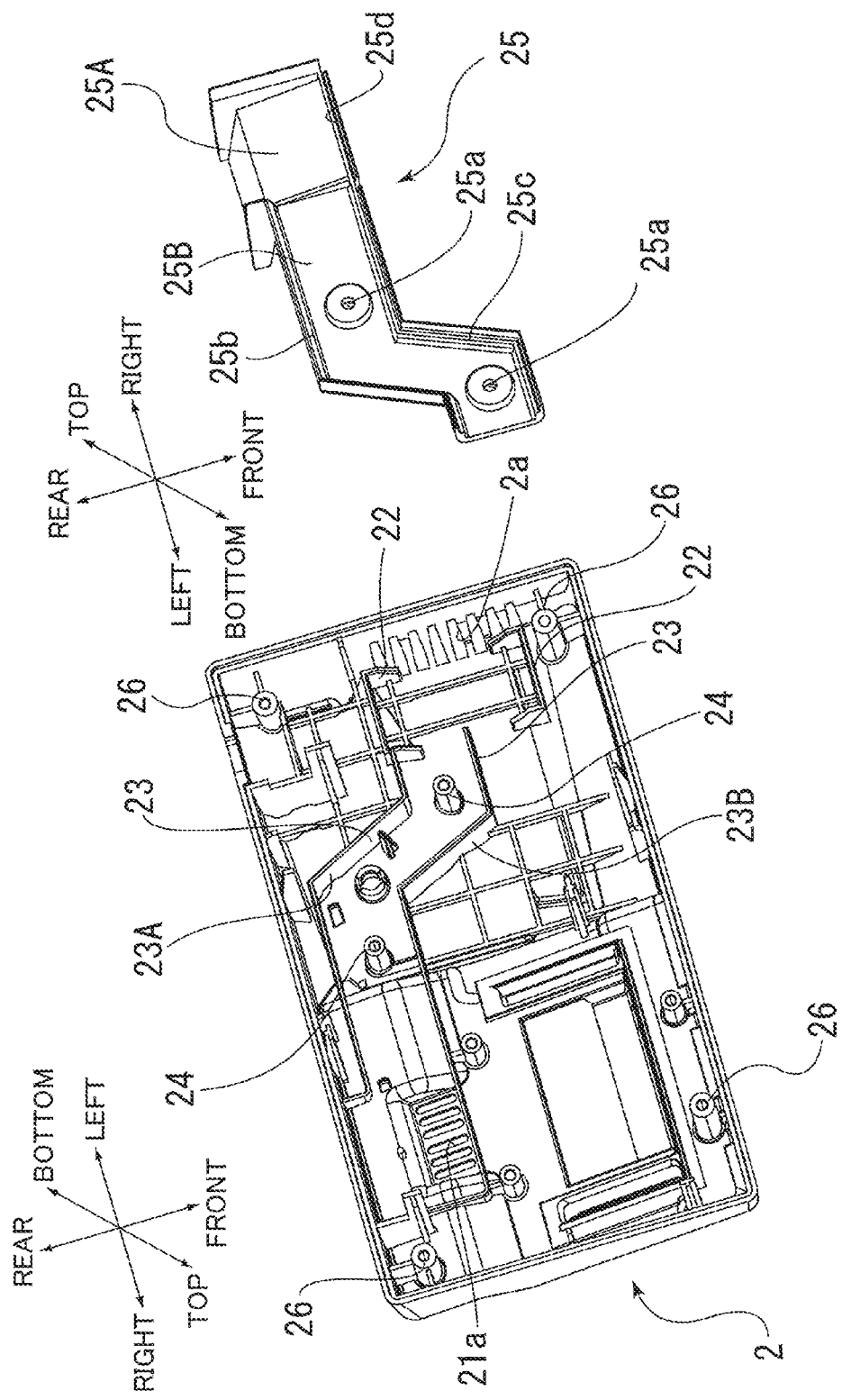
FIG. 3A
FIG. 3B

BATTERY CHARGER CAPABLE OF EFFICIENTLY COOLING SECONDARY BATTERY IN BATTERY PACK AND CHARGING CIRCUIT UNIT IN BATTERY CHARGER

CROSS REFERENCE TO RELATED APPLICATION

This application claims priority from Japanese Patent Application No. 2013-146381 filed Jul. 12, 2013. The entire content of the priority application is incorporated herein by reference.

TECHNICAL FIELD

The present invention relates to a battery charger. More specifically, the present invention relates to a battery charger that charges a battery pack used as a power supply for an electric power tool.

BACKGROUND

Conventionally, a battery charger used for charging a batter pack has been desired, in order to meet increased capacity of a secondary battery in the battery pack, to increase a charging current to ensure charging capacity and shorten charging time. However, increasing the charging current causes a large current to flow into a charging circuit in the battery charger and the secondary battery in the battery pack. This causes an extreme increase in temperature of the charging circuit and the secondary battery. As a result, degradation and malfunction of the secondary battery and components constituting the charging circuit may occur.

To solve the above-described problem, there is conventionally known a battery charger provided with an air intake fan that generates airflow for cooling a charging circuit therein and a secondary battery in a battery pack while the battery pack is being charged.

SUMMARY

However, in the conventional battery charger, air for cooling both the charging circuit and the secondary battery flows in a single air passage. Hence, the charging circuit and the secondary battery cannot be cooled separately by air flowing in separate air passages. Moreover, in the conventional battery charger, the charging circuit is cooled with airflow that has previously cooled the secondary battery and has consequently increased in temperature. This degrades efficient cooling of the charging circuit.

In view of the foregoing, it is an object of the present invention to provide a battery charger capable of efficiently cooling both a charging circuit in the battery charger and a secondary battery in a battery pack.

In order to attain the above and other objects, the present invention provides a battery charger that is configured to charge a battery pack including a secondary battery. The battery charger includes: a housing; and a charging circuit unit disposed in the housing. The housing defines a first air passage in which air flows to cool the secondary battery and a second air passage in which air flows to cool the charging circuit unit. The second air passage is independent from the first air passage.

According to another aspect, the present invention provides a battery charger configured to charge a battery pack including a battery pack casing and a secondary battery. The battery pack casing has an inlet port and an outlet port. The secondary battery is accommodated in the battery pack casing. The battery charger includes: a housing; a charging circuit unit; and a fan. The housing has an intake port and a discharge port, and includes a connecting part configured to be connected to the battery pack. The connecting part has a communication port configured to be in communication with the outlet port upon connection of the battery pack with the connecting part. The charging circuit unit is disposed in the housing. The fan is disposed in the housing and configured to draw air into the housing to generate airflow for cooling the secondary battery and the charging circuit unit. The housing defines a first air passage extending from the communication port to the discharge port, and a second air passage extending from the intake port to the discharge port. The second air passage is independent from the first air passage. The secondary battery is cooled by air flowing from the inlet port to the discharge port through the outlet port and the communication port in a state where the battery pack is connected to the connecting part. The charging circuit unit is cooled by air flowing from the intake port to the discharge port.

BRIEF DESCRIPTION OF THE DRAWINGS

The particular features and advantages of the invention as well as other objects will become apparent from the following description taken in connection with the accompanying drawings, in which:

FIG. 3A is a perspective view of an upper casing of the battery charger according to the embodiment, illustrating an interior thereof;

FIG. 3B is a perspective view of a closing member provided in the upper casing of the battery charger according to the embodiment;

DETAILED DESCRIPTION

Figure 1:
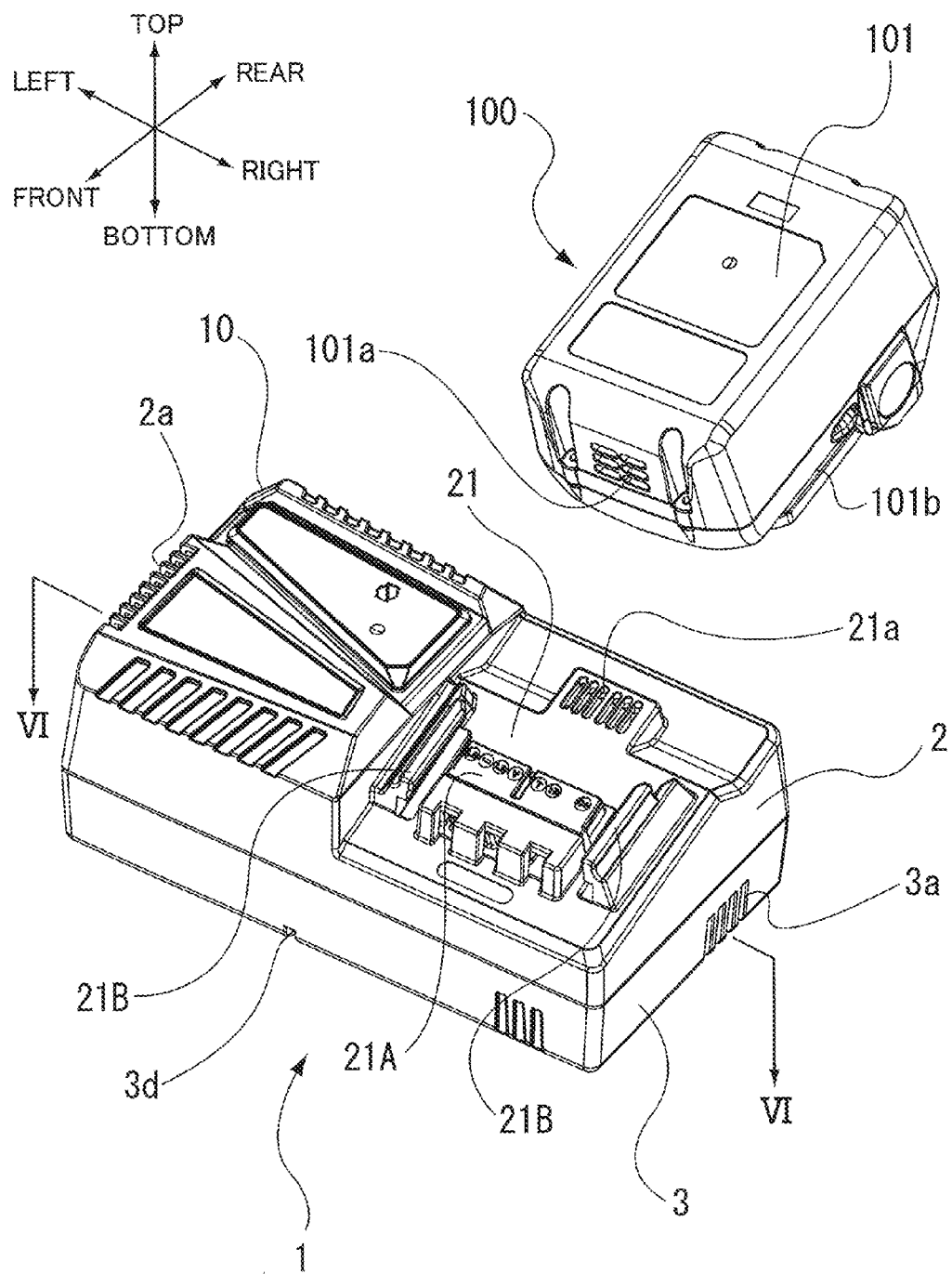
FIG. 1 is a perspective view of a battery charger according to one embodiment of the present invention and a battery pack charged by the battery charger.

A battery charger according to one embodiment of the present invention will be described while referring to FIGS.

1 through 9 wherein like parts and components are designated by the same reference numerals to avoid duplicating description. In the embodiment, the battery charger 1 is used for charging a battery pack 100. First, the battery pack 100 will be described while referring to FIGS. 1 and 2. Next, the battery charger 1 will be described while referring to FIGS. 1, 3A through 9.

In the following description, the terms "upward", "downward", "upper", "lower", "above", "below", "beneath", "right", "left", "front", "rear" and the like will be used assuming that the battery charger 1 is resting on a level surface and the battery pack 100 is connected to the battery charger 1 resting on a level surface. Directions related to the battery charger 1 and the battery pack 100 will be given based on direction arrows illustrated in each drawing.

Figure 2:
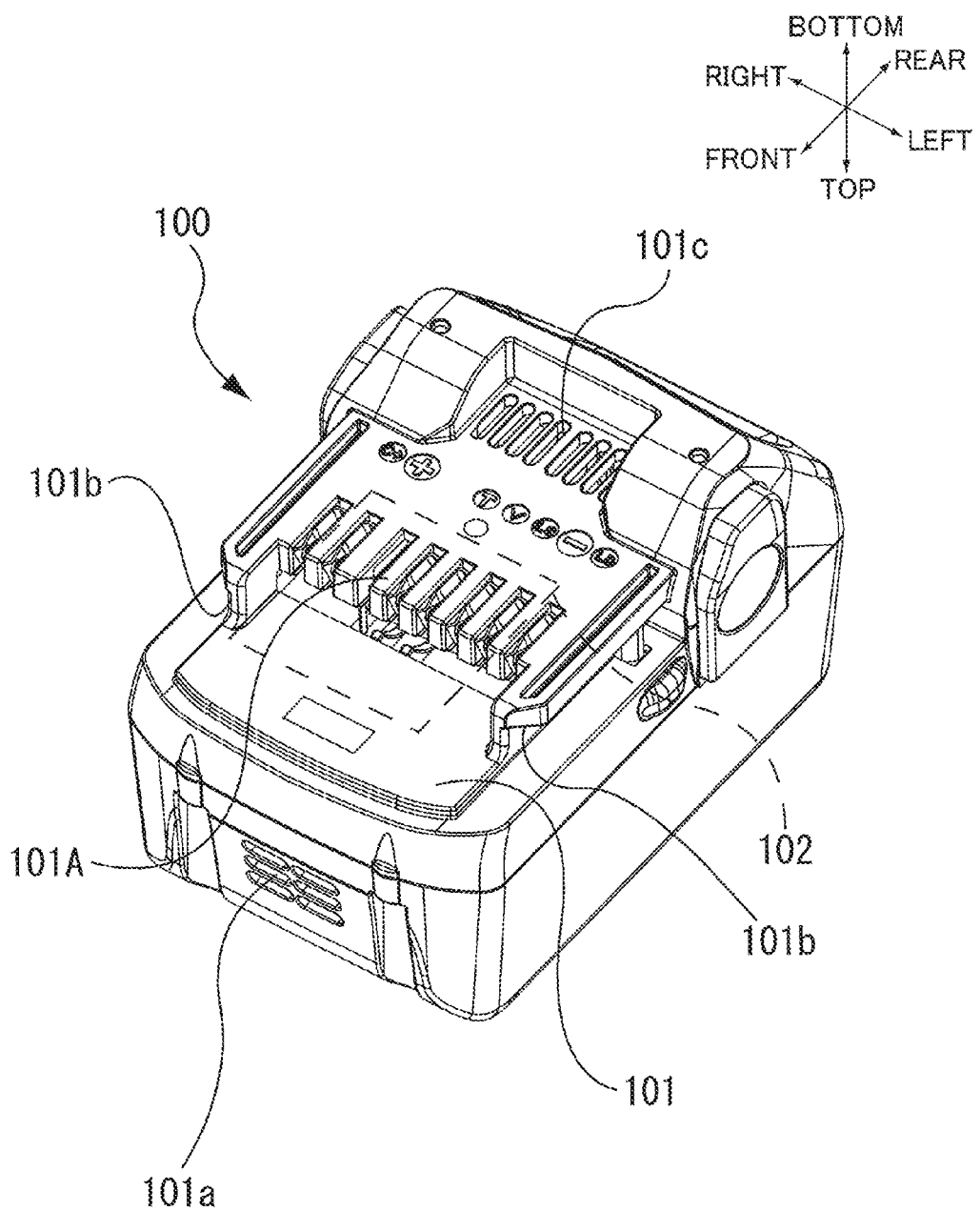
FIG. 2 is a perspective view of the battery pack according to the embodiment, as viewed from a bottom side thereof.

As illustrated in FIGS. 1 and 2, the battery pack 100 primarily includes a battery pack casing 101, and a secondary battery 102 accommodated in the battery pack casing 101. The secondary battery 102 is charged by connecting the battery pack 100 to the battery charger 1. The secondary battery 102 is a lithium-ion battery. For example, the lithium-ion battery consists of five cells connected in series to output 18V.

The battery pack casing 101 is formed into substantially a rectangular parallelepiped shape. The battery pack casing 101 has a front wall in which an inlet port 101a is formed, and a bottom wall in which a pair of slide grooves 101b and an outlet port 101c are formed.

The inlet port 101a is formed with a plurality of holes for drawing air into the battery pack casing 101. The outlet port 101c is formed at a rear portion of the bottom wall of the battery pack casing 101. The outlet port 101c is formed with a plurality of holes for discharging air drawn into the battery pack casing 101. The inlet port 101a is in communication with the outlet port 101c inside the battery pack casing 101. During charging of the battery pack 100, air is drawn into the battery pack casing 101 through the inlet port 101a, and discharged from the battery pack casing 101 through the outlet port 101c. Hence, an air passage (not illustrated) is defined in the battery pack casing 101 from the inlet port 101a to the outlet port 101c. The secondary battery 102 is cooled while the air flows from the inlet port 101a to the outlet port 101c. The air used for cooling the secondary battery 102 is discharged from the battery pack casing 101 through the outlet port 101c.

The slide grooves 101b are formed at respective left and right end portions of the bottom wall of the battery pack casing 101, extending in a front-rear direction. The slide grooves 101b are provided for mechanically connecting the battery pack 100 to the battery charger 1.

Further, a charging connecting part 101A is provided at an approximate center region of the bottom wall of the battery pack casing 101. The charging connecting part 101A is electrically connectable to the battery charger 1 via contact terminals (not illustrated) thereof.

As illustrated in FIG. 1 and FIGS. 3A through 6, the battery charger 1 includes a battery charger casing 10 as an example of a housing, a charging circuit unit 31, a fan 4, and a power cable 7.

As illustrated in FIG. 1, the battery charger casing 10 is formed into substantially a rectangular parallelepiped shape that is elongated in the left-right direction. The battery charger casing 10 includes an upper casing 2 (as an example of an upper housing), and a lower casing 3 (as an example of a lower housing) disposed below the upper casing 2. The upper casing 2 and the lower casing 3 are made of resin with heat-resisting properties and electrical-insulating properties.

The upper casing 2 constitutes an upper half of the battery charger casing 10. The upper casing 2 is formed in a rectangular box-like shape with a bottom opening.

The upper casing 2 has a top wall at which a battery connecting part 21 is provided. The battery connecting part 21 as an example of a connecting part is connectable to the battery pack 100. The battery connecting part 21 is disposed at a right portion of the top wall of the upper casing 2 and occupies approximately half of a surface area of the top wall of the upper casing 2. As illustrated in FIG. 1, the battery connecting part 21 has a communication port 21a, a terminal connecting part 21A, and a pair of engaging parts 21B.

The communication port 21a is formed at a rear portion of the battery connecting part 21. The communication port 21a is formed with a plurality of slits extending in the front-rear direction and arrayed in the left-right direction. When the battery pack 100 is connected to the battery charger 1 at the battery connecting part 21, the communication port 21a opposes the outlet port 101c of the battery pack 100. With this configuration, when the battery pack 100 is connected to the battery charger 1, air introduced into the battery pack casing 101 through the inlet port 101a and discharged from the battery pack casing 101 through the outlet port 101c can be drawn into the battery charger casing 10 through the communication port 21a.

The terminal connecting part 21A is disposed at an approximate center region of the battery connecting part 21. When the battery pack 100 is connected to the battery charger 1 at the battery connecting part 21, the terminal connecting part 21A is engaged with the charging connecting part 101A of the battery pack 100 to allow contact-terminals (not illustrated) of the terminal connecting part 21A to come into contact with contact-terminals (not illustrated) of the battery pack 100. Thus, electrical connection between the battery pack 100 and the battery charger 1 is established.

Figure 4:
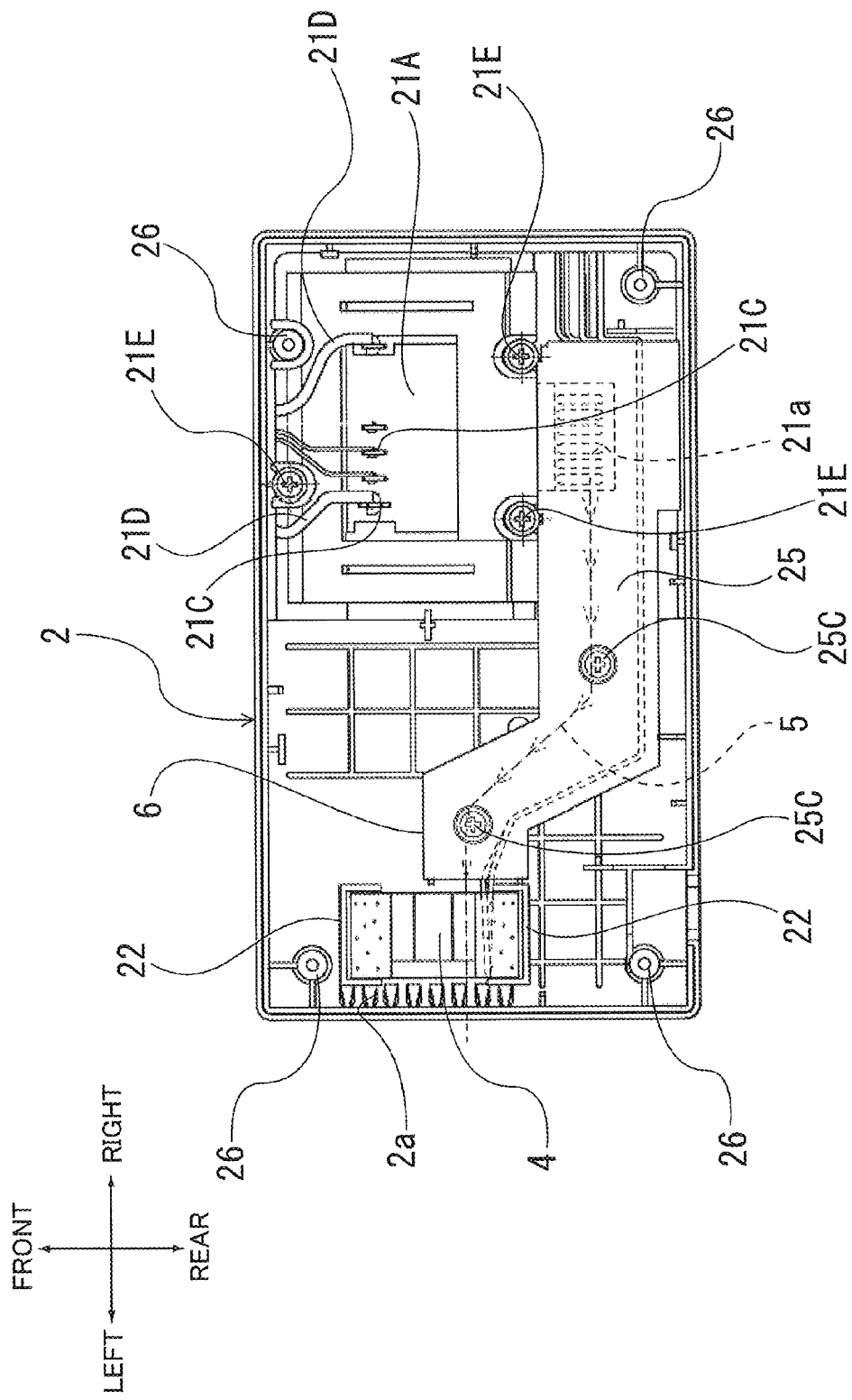
FIG. 4 is a plan view of the upper casing of the battery charger according to the embodiment, illustrating the interior thereof.

As illustrated in FIG. 4, screws 21E is screwed into the top wall of the upper casing 2 and the terminal connecting part 21A from a lower side thereof to fix the terminal connecting part 21A to the top wall of the upper casing 2. The terminal connecting part 21A includes a plurality of connection terminals 21C. The connection terminals 21C and the charging circuit unit 31 are electrically connected by connection lines 21D.

The engaging parts 21B are disposed on respective left and right sides of the terminal connecting part 21A, each extending in the front-rear direction. When the battery pack 100 is being connected to the battery charger 1 at the battery connecting part 21, the battery pack 100 is guided into connection with the battery charger 1 by sliding the slide grooves 101b of the battery pack 100 along the engaging parts 21B. The connection between the battery pack 100 and the battery charger 1 is stably maintained as a result of engagement of the pair of slide grooves 101b with the engaging parts 21B.

The upper casing 2 is formed with a discharge port 2a, spanning from a left wall of the upper casing 2 to the top wall of the upper casing 2. The discharge port 2a is formed with a plurality of slits extending in a vertical direction and arrayed in the front-rear direction. The discharge port 2a is in communication with the communication port 21a inside the battery charger casing 10. The discharge port 2a discharges air that has been introduced into the battery charger casing 10 through the communication port 21a and an intake port 3a (described later).

As illustrated in FIGS. 3A and 4, the upper casing 2 has a first supporting part 22, a rib part 23, a plurality of (two in the embodiment) fastening parts 24, and a plurality of (four in the embodiment) first engagement parts 26 at a lower surface of its top wall. As illustrated in FIG. 3B, the upper casing 2 also includes a closing member 25 that is attached to the rib part 23.

The first supporting part 22 is provided for supporting the fan 4 inside the battery charger casing 10. The first supporting part 22 is formed integrally with the upper casing 2. The first supporting part 22 protrudes downward from the lower surface of the top wall of the upper casing 2. The first supporting part 22 includes a front support rib and a rear support rib arranged in confrontation with each other in the front-rear direction. The front support rib of the first supporting part 22 is disposed at a position opposing a frontmost slit of the plurality of slits in the discharge port 2a in the left-right direction. The rear support rib of the first supporting part 22 is disposed at a position opposing a rearmost slit of the plurality of slits in the discharge port 2a in the left-right direction.

The rib part 23 includes a first rib 23A and a second rib 23B. The first rib 23A and the second rib 23B are formed integrally with the upper casing 2. The first rib 23A and the second rib 23B protrude downward from the lower surface of the top wall of the upper casing 2. The first rib 23A and the second rib 23B extend in the left-right direction from a position where the communication port 21a is disposed to a position where the first supporting part 22 is disposed, while maintaining a constant interval therebetween in the front-rear direction. Approximate left-right center portions of the first rib 23A and the second rib 23B have slanting portions, respectively, which slant with respect to the front-rear direction.

The fastening parts 24 protrude downward from the lower surface of the top wall of the upper casing 2. One of the fastening parts 24 is provided at a position intermediate in the front-rear direction between a left end portion of the first rib 23A and a left end portion of the second rib 23B. The other of the fastening parts 24 is provided at a position intermediate in the front-rear direction between an approximate left-right center portion of the first rib 23A and an approximate left-right center portion of the second rib 23B. The fastening parts 24 are provided for fastening the closing member 25 to the rib part 23.

The first engagement parts 26 are formed integrally with the upper casing 2. The first engagement parts 26 protrude downward from the lower surface of the top wall of the upper casing 2 at positions in the vicinity of respective corners thereof. The first engagement parts 26 are provided for attaching the upper casing 2 to the lower casing 3.

As illustrated in FIG. 3B, the closing member 25 has a shape such that a space defined by the first rib 23A and the second rib 23B is covered in a state where the closing member 25 is attached to the rib part 23. The closing member 25 includes a guide part 25A and a flat part 25B. Further, the closing member 25 has a plurality of (two in the embodiment) fastening holes 25a, a first stepped part 25b, a second stepped part 25c, and a third stepped part 25d.

The guide part 25A is provided integrally with the flat part 25B and positioned on a right side of the flat part 25B. The guide part 25A opposes the communication port 21a in a vertical direction in a state where the closing member 25 is attached to the rib part 23. When water droplets have entered into the battery charger casing 10 through the communication port 21a, the guide part 25A guides the water droplets out of the battery charger casing 10.

The flat part 25B has a width in the front-rear direction that is substantially the same as the interval between the first rib 23A and the second rib 23B in the front-rear direction.

The fastening holes 25a are formed in the flat part 25B at positions corresponding to the fastening parts 24.

The first stepped part 25b is provided at a rear edge of the flat part 25B. The second stepped part 25c is provided at a front edge of the flat part 25B. The third stepped part 25d is provided at a front edge of the guide part 25A. The third stepped part 25d continuously extends from the second stepped part 25c. The first stepped part 25b is formed into a shape in accordance with the shape of the first rib 23A. The second stepped part 25c and the third stepped part 25d in combination are formed into a shape in accordance with the shape of the second rib 23.

When the closing member 25 is attached to the rib part 23, the first rib 23A is engaged with the first stepped part 25b, and the second rib 23B is engaged with the second stepped part 25c and the third stepped part 25d.

Figure 6:
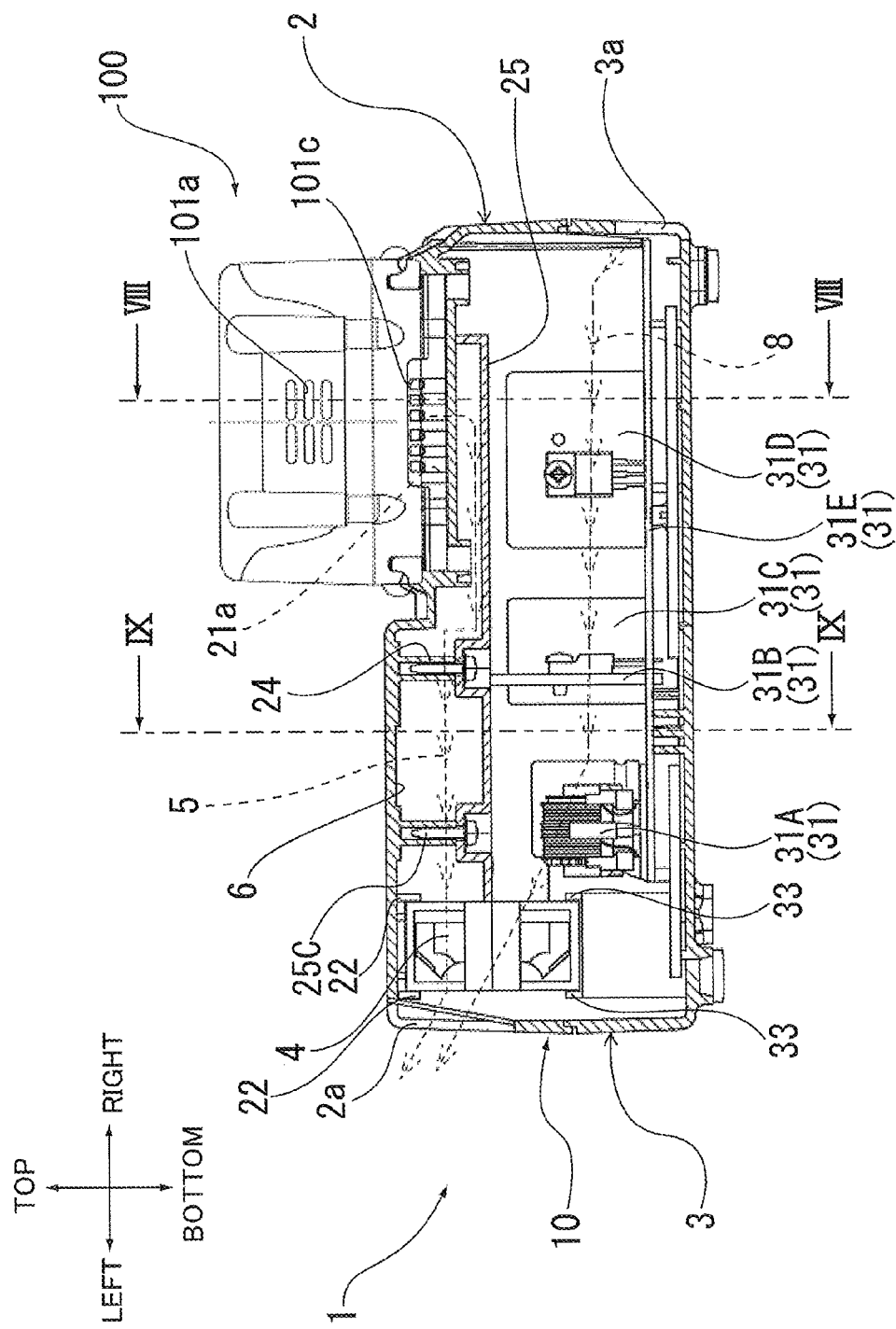
FIG. 6 is a cross-sectional view of the battery charger according to the embodiment, taken along a line VI-VI in FIGS. 1 and 5A.

As illustrated in FIGS. 4 and 6, the closing member 25 is attached to the rib part 23 by inserting screws 25C into the fastening holes 25a and screwing the screws 25C into the fastening parts 24. As a result of attachment of the closing member 25 to the rib part 23, a duct 6 is defined by the rib part 23, the closing member 25, and the lower surface of the top wall of the upper casing 2.

The duct 6 provides an air passage from the communication port 21a to the fan 4. A first air passage 5 is defined by the air passage (not illustrated) in the battery pack 100 from the inlet port 101a to the outlet port 101c, the duct 6, and the discharge port 2a. The first air passage 5 provides communication between the inlet port 101a, the outlet port 101c, the communication port 21a, and the discharge port 2a. Thus, in the first air passage 5, air is drawn into the battery pack casing 101 through the inlet port 101a, and flows through the outlet port 101c and the communication port 21a to be introduced into the battery charger casing 10, and is then discharged from the battery charger casing 10 through the discharge port 2a.

Figure 9:
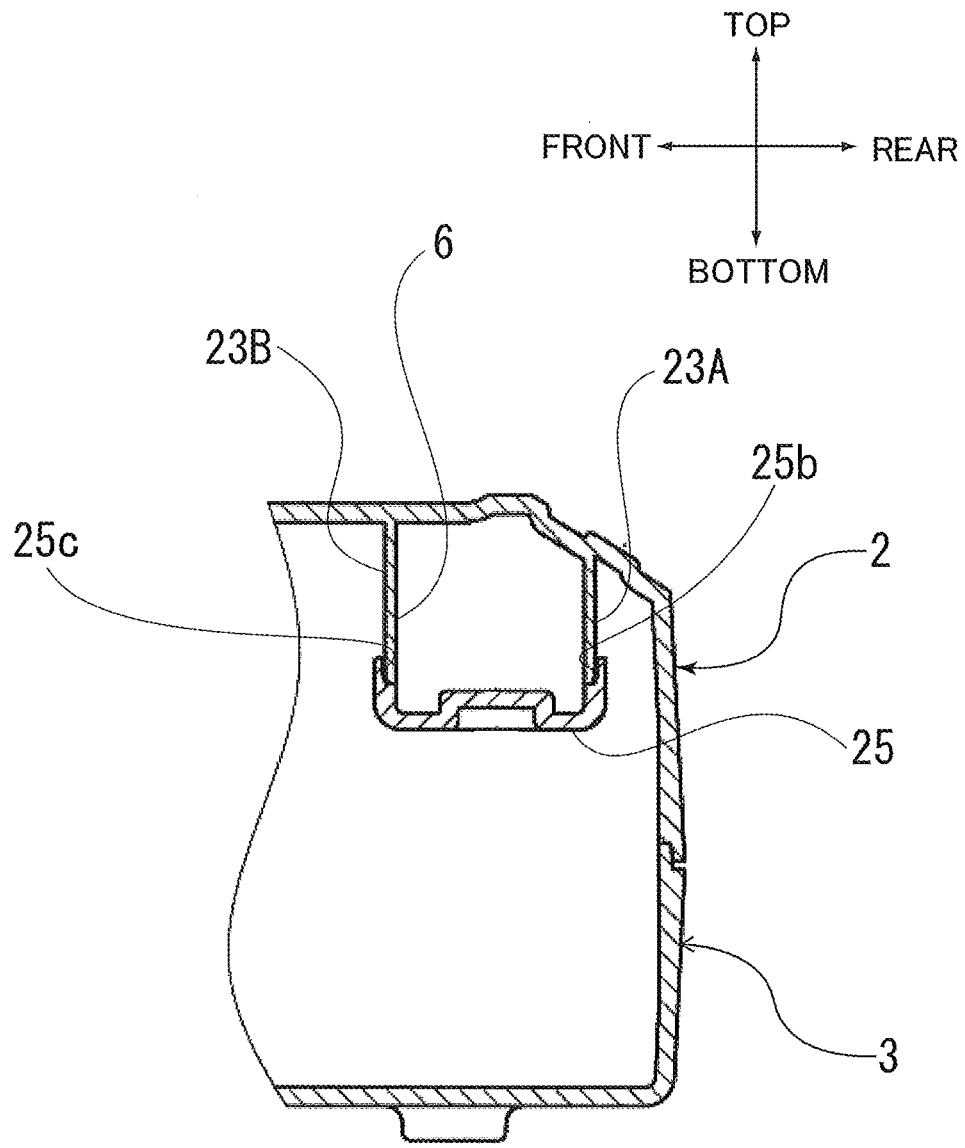
FIG. 9 is a partial cross-sectional view of the battery charger according to the embodiment, taken along a line IX-IX in FIG. 6.

As illustrated in FIG. 9, the closing member 25 is attached to the rib part 23 in a state where the first stepped part 25b is engaged with the first rib 23A, and the second stepped part 25c and the third stepped part 25d are engaged with the second rib 23B. More specifically, top edges of the first stepped part 25b, the second stepped part 25c, and the third stepped part 25d have an L-shaped cross-section as viewed in the left-right direction, respectively. Thus, a contact area between the bottom edge of the first rib 23A and the L-shaped top edge of the first stepped part 25b when the first rib 23A and the first stepped part 25b are engaged with each other becomes greater, compared to a case where the top edge of the first stepped part 25b has an I-shaped (i.e. flat shaped) cross-section. Likewise, the L-shaped top edge of the second stepped part 25c makes a contact area between the bottom edge of the second rib 23B and the top edge of the second stepped part 25c greater, and the L-shaped top edge of the third stepped part 25d makes a contact area between the bottom edge of the second rib 23B and the top edge of the third stepped part 25d greater. Hence, the duct 6 has a highly airtight structure.

The lower casing 3 constitutes a lower half of the battery charger casing 10. The lower casing 3 is formed in a rectangular box-like shape with a top opening.

As illustrated in FIG. 5B, the lower casing 3 is formed with an intake port 3a, spanning from a right wall of the lower casing 3 to a bottom wall of the lower casing 3. The intake port 3a is formed with a plurality of slits extending in the vertical direction and arrayed in the front-rear direction. The intake port 3*a* draws air into the battery charger casing 10. The intake port 3*a* is in communication with the discharge port 2*a* inside the battery charger casing 10. Thus, a second air passage 8 is defined in the battery charger casing 10 from the intake port 3*a* to the discharge port 2*a*.

As illustrated in FIG. 5A, the lower casing 3 has a plurality of (four in the embodiment) second engagement parts 32, and a second supporting part 33.

The second engagement parts 32 are formed integrally with the lower casing 3. The second engagement parts 32 protrude upward from an upper surface of a bottom wall of the lower casing 3 at positions in the vicinity of respective corners thereof. That is, the second engagement parts 32 are provided at positions corresponding to the first engagement parts 26. Lower ends of the first engagement parts 26 are engaged with upper ends of the corresponding second engagement parts 32, and the respective pairs of the first engagement parts 26 and the second engagement parts 32 are fastened by screws (not illustrated), inserting the screws thereinto from a lower side of the bottom wall of the lower casing 3. Hence, the upper casing 2 is assembled to the lower casing 3 to provide the battery charger casing 10.

The second supporting part 33 is provided for supporting the fan 4 inside the battery charger casing 10 in cooperation with the first supporting part 22 of the upper casing 2. The second supporting part 33 is formed integrally with the lower casing 3. The second supporting part 33 protrudes upward from the upper surface of the bottom wall of the lower casing 3. The second supporting part 33 is includes a front support rib and a rear support rib arranged in confrontation with each other in the front-rear direction. The second supporting part 33 is provided at a position corresponding to the first supporting part 22.

The charging circuit unit 31 is provided in the battery charger casing 10. More specifically, the charging circuit unit 31 is accommodated in an internal space defined by the lower casing 3.

The charging circuit unit 31 primarily includes a line filter 31A, an FET 31B, a transformer 31C, a diode 31D, and a board 31E. The connection lines 21D are connected to the charging circuit unit 31 to electrically connect the charging circuit unit 31 to the battery pack 100 via the connection terminals 21C. By adjusting and controlling a charging current and a charging voltage based on prescribed conditions, the charging circuit unit 31 carries out charging of the battery pack 100 in a safe and rapid fashion.

The board 31E is a substantially rectangular shape in a plan view. The board 31E is disposed between the intake port 3*a* and the second supporting part 33. The line filter 31A, the FET 31B, the transformer 31C, and the diode 31D are disposed on an upper surface of the board 31E in this order from left to right. The line filter 31A, the FET 31B, the transformer 31C, and the diode 31D are elements emitting heat during charging of the battery pack 100. Heat dissipating fins are attached to the FET 31B and the diode 31D.

As illustrated in FIG. 6, in a state where the upper casing 2 is assembled to the lower casing 3, the closing member 25 is positioned above the charging circuit unit 31. Hence, the first air passage 5 and the second air passage 8 are independent from each other.

Figure 7:
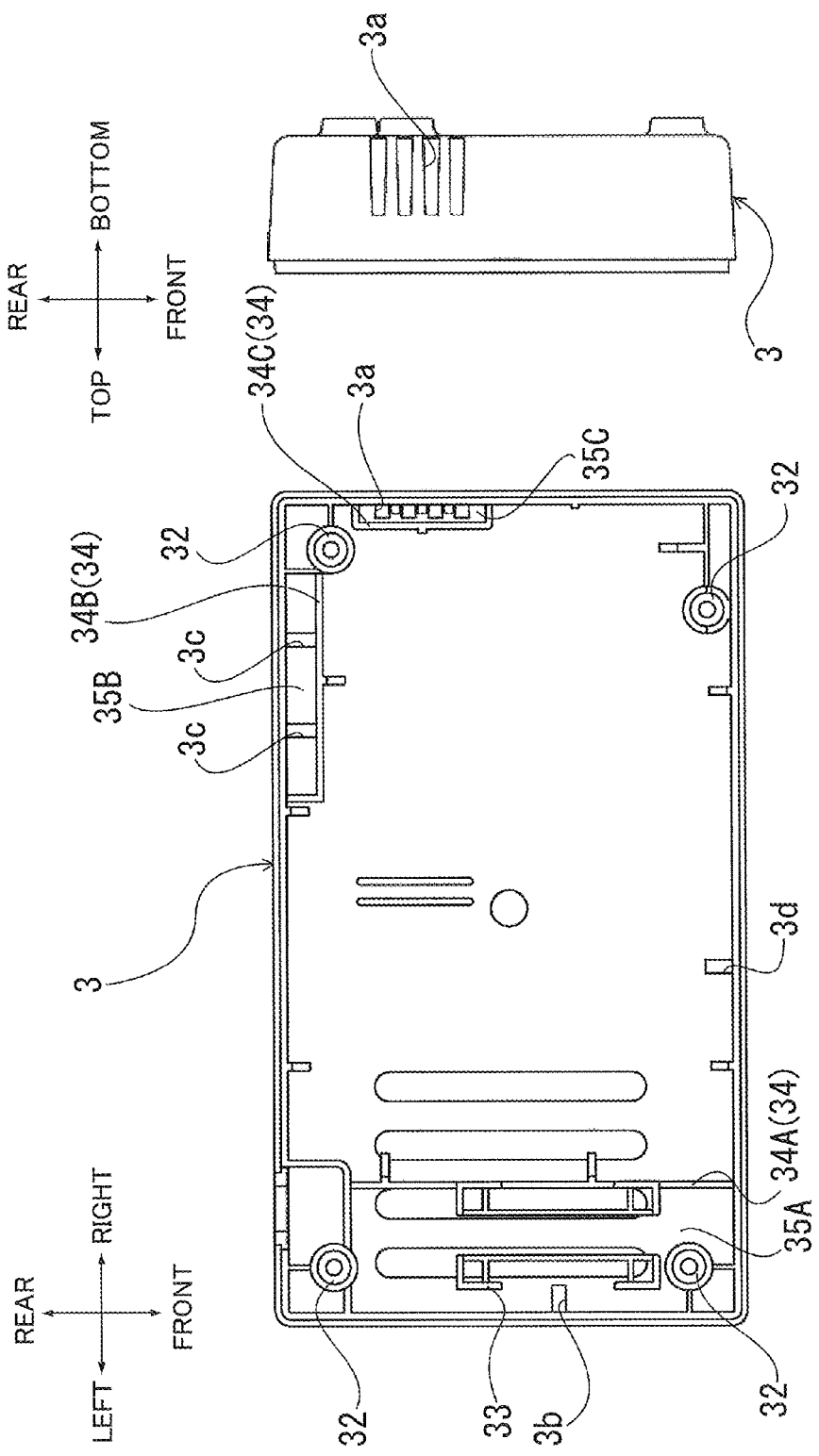
FIG. 7A is a plan view of the lower casing of the battery charger according to the embodiment from which a fan, a power cable, and a charging circuit unit are omitted, illustrating the interior thereof.
FIG. 7B is a right side view of the lower casing of the battery charger according to the embodiment.
Figure 8:
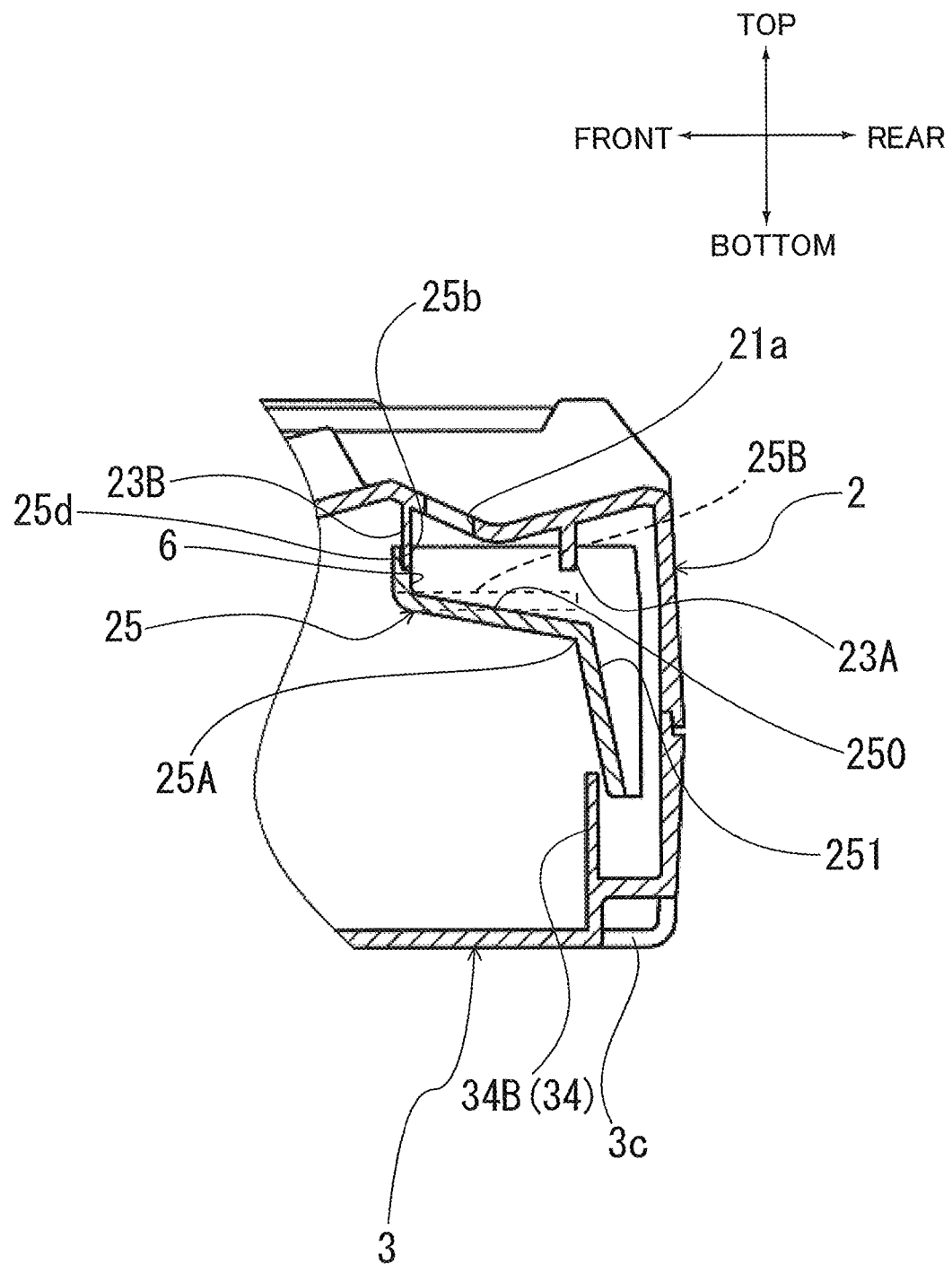
FIG. 8 is a partial cross-sectional view of the battery charger according to the embodiment, taken along a line VIII-VIII in FIG. 6.

As illustrated in FIGS. 7 and 8, the lower casing 3 is formed with a first drainage port 3*b*, a plurality of (two in the embodiment) second drainage ports 3*c*, and a third drainage port 3*d*.

The first drainage port 3*b* is formed at a left end portion of the lower casing 3. Water droplets that have entered the battery charger casing 10 through the discharge port 2*a* are drained out of the battery charger casing 10 through the first drainage port 3*b*.

The second drainage ports 3*c* are formed at a rear end portion of the lower casing 3 at its right end. The second drainage ports 3*c* are provided at positions not overlapping with the charging circuit unit 31 in a plan view. Water droplets that have entered the battery charger casing 10 through the communication port 21*a* are drained out of the battery charger casing 10 through the second drainage ports 3*c* via the guide part 25A of the closing member 25.

The third drainage port 3*d* is formed at a front end portion of the lower casing 3 at its left-right center.

As illustrated in FIGS. 7 and 8, the lower casing 3 has a plurality of waterproofing walls 34. The waterproofing walls 34 are provided for preventing water droplets entered the battery charger casing 10 from coming into contact with the charging circuit unit 31. The waterproofing walls 34 are formed so as to protrude upward from the upper surface of the bottom wall of the lower casing 3. The waterproofing walls 34 include a first waterproofing wall 34A, a second waterproofing wall 34B, and a third waterproofing wall 34C.

The first waterproofing wall 34A is disposed between the second supporting part 33 and the charging circuit unit 31. The first waterproofing wall 34A extends in the front-rear direction from a front wall of the lower casing 3 to a rear wall of the lower casing 3. The first waterproofing wall 34A defines a first drainage area 35A in cooperation with the bottom, front, rear, and left walls of the lower casing 3. The first drainage port 3*b* is located in the first drainage area 35A. With this configuration, the first drainage area 35A and the charging circuit unit 31 are isolated from each other.

The second waterproofing wall 34B is formed so as to surround the second drainage ports 3*c* in a plan view. The second waterproofing wall 34B defines a second drainage area 35B in cooperation with the rear wall of the lower casing 3. The second drainage ports 3*c* are located in the second drainage area 35B. Hence, the second waterproofing wall 34B isolates the charging circuit unit 31 from the second drainage area 35B.

The third waterproofing wall 34C is formed so as to surround the intake port 3*a* in a plan view. The third waterproofing wall 34C defines a third drainage area 35C in cooperation with a right wall of the lower casing 3. The intake port 3*a* is located in the third drainage area 35C. Hence, the third waterproofing wall 34C isolates the charging circuit unit 31 from the third drainage area 35C.

The charging circuit unit 31 is isolated from the respective drainage areas 35A, 35B, and 35C by the waterproofing walls 34. With this configuration, contact of water droplets with the charging circuit unit 31 can be effectively prevented. Further, malfunctions of the battery charger 1 due to short circuits in the charging circuit unit 31 caused by water droplets entering the battery charger casing 10 can be restrained.

As illustrated in FIG. 8, the guide part 25A of the closing member 25 constituting a part of the duct 6 has an inclining portion 250 and an extending portion 251. The inclining portion 250 has a front edge at which the third stepped part 25*d* is provided, and a rear edge in confrontation with the front edge in the front-rear direction. The inclining portion 250 inclines slightly downward, while extending from the front edge toward the rear edge. The extending portion 251 extends downward from the rear edge of the inclining portion 250 toward the second drainage ports 3*c*. The front edge of the inclining portion 250 is in flush with the front edge of the flat part 25B, but the rear edge of the inclining portion 250 is further downward than the rear edge of the flat part 25B.

Water droplets that have entered the battery charger casing 10 through the communication port 21a move over the inclining portion 250 toward the extending portion 251, and are drained out of the battery charger casing 10 through the second drainage ports 3c. Hence, malfunctions of the battery charger 1 due to short circuits in the charging circuit unit 31 caused by water droplets entering the battery charger casing 10 through the communication port 21a can be inhibited. In addition, the degree of waterproofing of the charging circuit unit 31 can be decreased, thereby reducing costs for waterproofing the charging circuit unit 31.

Moreover, water droplets that have entered the battery charger casing 10 through the communication port 21a can be effectively guided to the second drainage ports 3c by the inclining portion 250 that is positioned lower than the flat part 25B. Thus, the water droplets are not guided to the flat part 25B constituting a part of the duct 6. As a result, the fan 4 is kept away from the water droplets. Accordingly, not only malfunctions of the charging circuit unit 31 due to short circuits in the charging circuit unit 31 caused by water droplets entering the battery charger casing 10, but also malfunctions of the fan 4 caused by water droplets entering the battery charger casing 10, can be inhibited.

Figure 5:
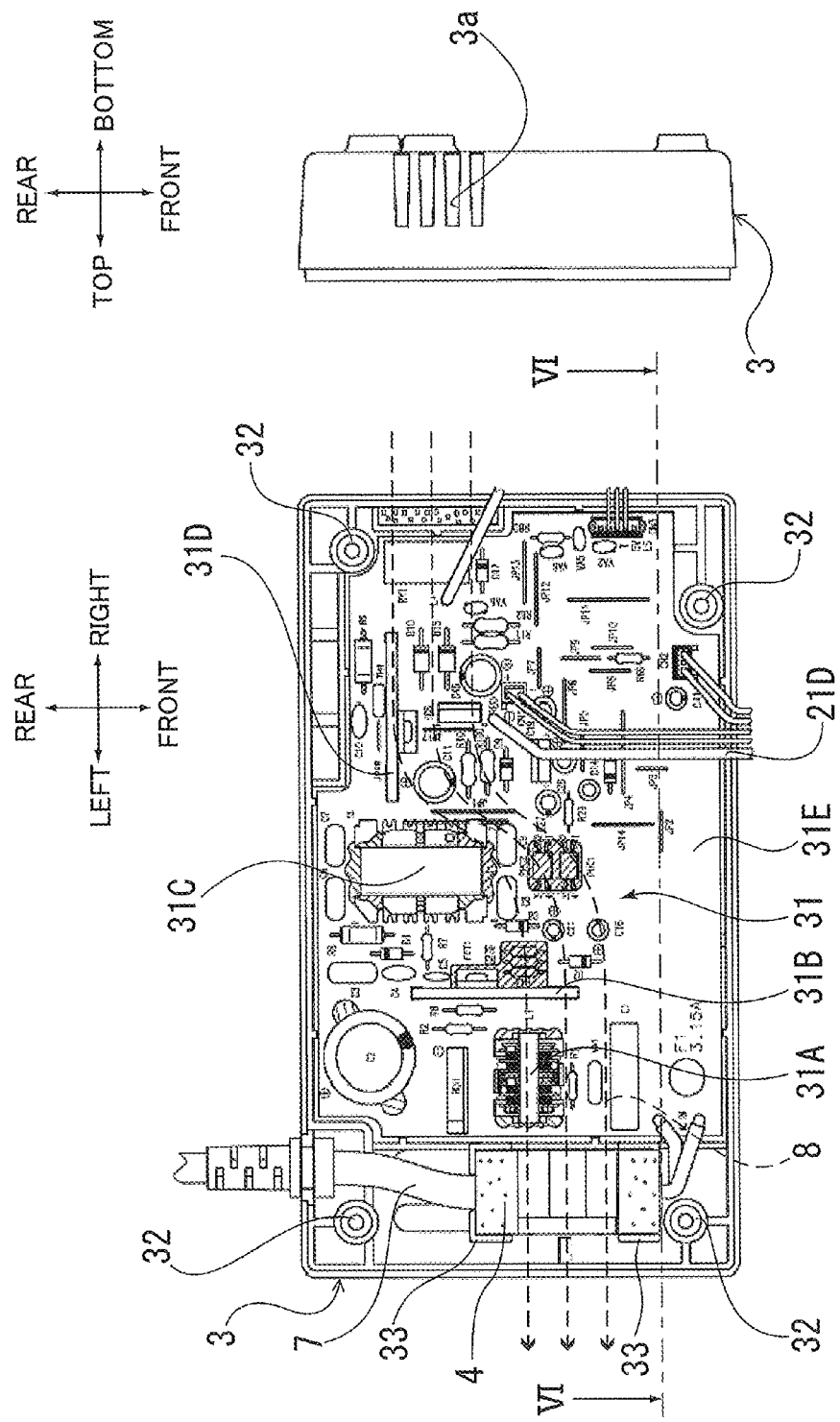
FIG. 5A is a plan view of a lower casing of the battery charger according to the embodiment, illustrating an interior thereof.
FIG. 5B is a right side view of the lower casing of the battery charger according to the embodiment.

The fan 4 is adapted to generate airflow that cools the charging circuit part 31 and the secondary battery 102. As illustrated in FIGS. 4 to 6, the fan 4 is supported in the battery charger casing 10. More specifically, the fan 4 is sandwiched between the first fan-supporting part 22 and the second supporting part 33 in the vertical direction. The fan 4 is disposed between the charging circuit unit 31 and the discharge port 2a in the left-right direction. Further, the fan 4 is disposed opposite to the intake port 3a with respect to the charging circuit unit 31 in the left-right direction.

As illustrated in FIG. 6, a left edge of the closing member 25 is positioned so as to oppose a substantial vertical center of the fan 4. Hence, the fan 4 spans both the first air passage 5 and the second air passage 8. With this configuration, the fan 4 can draw air into the battery charger casing 10 through the communication port 21a and the intake port 3a, and discharge the air from the battery charger casing 10 through the discharge port 2a.

The power cable 7 is connectable to a commercial power supply (not illustrated) and adapted to supply power to the charging circuit part 31 and the fan 4. The power cable 7 has one end connected to the fan 4 and the charging circuit unit 31, and another end connectable to a commercial power supply (not illustrated).

Next, an operation of the battery charger 1 for charging the battery pack 100 will be described. When the power cable 7 is connected to the commercial power supply (not illustrated), and the battery pack 100 is connected to the battery charger 1 at the battery connecting part 21, charging of the battery pack 100 starts. Upon start of the charging of the battery pack 100, the fan 4 starts to rotate.

The rotating fan 4 draws air through the inlet port 101a and discharges the air through the discharge port 2a. The secondary battery 102 of the battery pack 100 is cooled using the first air passage 5, while the air flows from the inlet port 101a to the discharge port 2a. The rotating fan 4 also draws air through the intake port 3a and discharges the air through the discharge port 2a. The charging circuit unit 31 of the battery charger 1 is cooled using the second air passage 8, while the air flows from the intake port 3a to the discharge port 2a.

More specifically, as illustrated in FIGS. 4 and 6, the first air passage 5 is a path that starts at the inlet port 101a of the battery pack 100, runs through the outlet port 101c of the battery pack 100 and the communication port 21a of the battery charger 1, and ends at the discharge port 2a of the battery charger 1. When the fan 4 starts rotating, a negative pressure is generated in the first air passage 5, and air flows into the battery pack casing 101 through the inlet port 101a. The air that has flowed into the battery pack casing 101 cools the secondary battery 102, and is then discharged from the battery pack casing 101 through the outlet port 101c. The air that has been discharged from the battery pack casing 101 through the outlet port 101c flows into the battery charger casing 10 through the communication port 21a. The air that has flowed into the battery charger casing 10 flows through the duct 6 toward the fan 4. Then, the air is discharged from the battery charger casing 10 through the discharge port 2a.

Note that, the first air passage 5 extends from the inlet port 101a to the discharge port 2a through the outlet port 101c and the communication port 21a in a state where the battery pack 100 is connected to the battery charger 1. However, in a state where the battery pack 100 is not connected to the battery charger 1, the first air passage 5 extends from the communication port 21a to the discharge port 2a.

As illustrated in FIGS. 5 and 6, the second air passage 8 is a path that starts at the intake port 3a and ends at the discharge port 2a. When the fan 4 starts rotating, air flows into the battery charger casing 10 through the intake port 3a. The air that has flowed into the battery charger casing 10 cools the charging circuit unit 31, while flowing toward the fan 4. Then, the air is discharged from the battery charger casing 10 through the discharge port 2a.

In other words, when the fan 4 starts rotating, the fan 4 generates a first airflow flowing from the inlet port 101a to the discharge port 2a through the outlet port 101c and the communication port 21a, thereby cooling the secondary battery 102 in the battery pack 100, and also generates a second airflow flowing from the intake port 3a to the discharge port 2a, thereby cooling the charging circuit unit 31 in the battery charger casing 10.

The battery charger 1 cools both the secondary battery 102 in the battery pack 100 and the charging circuit unit 31 in the battery charger 1, while charging the battery pack 100. When the charging circuit unit 31 detects that the secondary battery 102 is fully charged, the battery charger 1 stops charging and the fan 4 stops rotating.

Since the communication port 21a of the battery charger 1 is in communication with the outlet port 101c of the battery pack 100 when the battery pack 100 is connected to the battery charger 1, the rotation of the fan 4 can cause air to be drawn into the battery pack casing 101 through the inlet port 101a of the battery pack 100. Hence, the secondary battery 102 in the battery pack 100 can be cooled by the air flowing in the air passage (not illustrated) defined in the battery pack casing 101.

Further, the rotation of the fan 4 can cause air to flow in the second air passage 8 running from the intake port 3a to the discharge port 2a. Hence, the charging circuit unit 31 can be cooled by the air flowing in the second air passage 8. With this configuration, it is not necessary for heat generating elements constituting the charging circuit unit 31, such as the FET 31B, the transformer 31C, and the diode 31D, to enhance heat resistivity, and costs therefor can thus be reduced.

Moreover, by utilizing the duct 6, the first air passage 5 and the second air passage 8 are partitioned from each other, and thus, independent from each other. The first air passage 5 serves as a dedicated cooling path for cooling the secondary battery 102, and the second air passage 8 serves as a dedicated cooling path for cooling the charging circuit unit 31. Hence, situations can be avoided in which airflow which has cooled one of the secondary battery 102 and the charging circuit unit 31 is required to be used to cool the other. Accordingly, both the secondary battery 102 and the charging circuit unit 31 can be sufficiently cooled using the dedicate cooling paths, thereby preventing degradation of the secondary battery 102 in the battery pack 100 and malfunctions of components constituting the charging circuit unit 31 caused by elevated temperatures of the secondary battery 102 and the charging circuit unit 31.

Further, since the first air passage 5 includes the duct 6 running from the communication port 21a to the fan 4, the first air passage 5 and the second air passage 8 can be made independent from each other, using a low-cost, simple method.

Further, since the rib part 23 is provided inside the battery charger casing 10, and the duct 6 is defined by the battery charger casing 10, the rib part 23, and the closing member 25 attached to the rib part 23, the duct 6 can be easily provided by using the rib part 23 and the closing member 25. The rib part 23 also serves as a reinforcing member for reinforcing the battery charger casing 10.

Further, since the fan 4 is disposed both in the first air passage 5 and in the second air passage 8, airflow in the first air passage 5 and airflow in the second air passage 8 can both be generated by the single fan 4. Hence, it is not necessary to provide separate fans for the respective air passages 5 and 8 in the battery charger 1. As a result, size increases in the battery charger 1 can be avoided, and costs for providing additional fans can be reduced.

Further, the fan 4 rotates so as to draw air through the inlet port 101a and the intake port 3a and to discharge the air through the discharge port 2a. The fan 4 is positioned on a side where the discharge port 2a is formed and on a downstream side of the charging circuit unit 31 in a direction in which the air flows. With this configuration, the fan 4 cools the secondary battery 102 with air drawn through the inlet port 101a, and also cools the charging circuit unit 31 with air drawn through the intake port 3a. The air that has cooled the secondary battery 102 and the charging circuit unit 31 is discharged through the discharge port 2a.

Thus, compared to a case where the secondary battery 102 and the charging circuit unit 31 are cooled by air directly from the fan 4, the fan 4 provides efficient airflows from the inlet port 101a to the discharge port 2a and from the intake port 3a to the discharge port 2a for cooling the secondary battery 102 and the charging circuit unit 31, respectively, with the result that the efficiency of cooling the secondary battery 102 and the charging circuit unit 31 is increased.

Further, a spigot joint structure between the stepped parts 25b, 25c, 25d and the ribs 23A, 23b enables the duct 6 in the first air passage 5 to maintain high air tightness. Hence, air intake by the fan 4 is carried out efficiently.

Further, since the fan 4 is positioned opposite to the intake port 3a with respect to the charging circuit unit 31 in the left-right direction, the charging circuit unit 31 in its entirety can be cooled reliably and efficiently by the airflow running through the second air passage 8.

While the present invention has been described in detail with reference to the embodiments thereof, it would be apparent to those skilled in the art that various changes and modifications may be made therein without departing from the spirit of the present invention.

What is claimed is:

1. A battery charger configured to charge a battery pack including a secondary battery, the battery charger comprising:
   a housing having an outer wall, the housing including a connecting part disposed at the outer wall, the connecting part being configured to be connected to the battery pack and having a communication port for providing communication between an interior of the housing and an exterior of the housing, the communication port opposing a first opening of the battery pack and being in communication with the first opening upon connection of the battery pack to the connecting part;
   a charging circuit unit disposed in the housing;
   a first air passage in which air flows in the housing, the first air passage being fluidly connected to an interior of the battery pack through the communication port and the first opening upon connection of the battery pack to the connecting part to cool the secondary battery; and
   a second air passage in which air flows in the housing to cool the charging circuit unit, the second air passage being independent from the first air passage such that air passing through the first air passage does not mix with air passing through the second air passage.

2. The battery charger as claimed in claim 1, further comprising a duct disposed in the housing, the first air passage and the second air passage being partitioned by the duct.

3. The battery charger as claimed in claim 2, wherein the housing comprises:
   an upper housing configured to be connected to the battery pack and including a closing member configured to provide the duct; and
   a lower housing configured to accommodate the charging circuit unit therein.

4. The battery charger as claimed in claim 3, wherein the upper housing includes a rib part configured to be engaged with the closing member, the first air passage being defined by the rib part and the closing member.

5. The battery charger as claimed in claim 1, further comprising a fan disposed in the housing, the fan being configured to draw air into the housing to generate a first airflow flowing in the first air passage and a second airflow flowing in the second air passage.

6. The battery charger as claimed in claim 5, wherein the fan comprises a single fan.

7. The battery charger as claimed in claim 5, wherein the second airflow generated by the fan flows in a flowing direction,
   wherein the fan is disposed downstream of the charging circuit unit in the flowing direction.

8. The battery charger as claimed in claim 1, wherein the housing has a discharge port and an intake port,
   the battery charger further comprising a fan disposed in the housing and configured to draw air into the housing to generate a first airflow in the first air passage and a second airflow in the second air passage,
   wherein, in a state where the battery pack is connected to the connecting part, the first airflow cools the secondary battery while flowing from a second opening of the battery pack serving as an inlet port to the discharge port through the first opening of the battery pack serving as an outlet port and the communication port,
   wherein the second airflow cools the charging circuit unit while flowing from the intake port to the discharge port.

9. The battery charger as claimed in claim 8, wherein the second airflow generated by the fan flows in a flowing direction,
wherein the fan is disposed downstream of the charging circuit unit in the flowing direction.

10. A battery charger configured to charge a battery pack including a battery pack casing and a secondary battery accommodated in the battery pack casing, the battery pack casing having an inlet port and an outlet port, the battery charger comprising:
a housing having an outer wall, an intake port and a discharge port, the housing including a connecting part disposed at the outer wall and configured to be connected to the battery pack, the connecting part having a communication port for providing communication between an interior of the housing and an exterior of the housing, the communication port opposing the outlet port and being in communication with the outlet port upon connection of the battery pack with the connecting part;
a charging circuit unit disposed in the housing;
a fan disposed in the housing and configured to draw air into the housing to generate airflow for cooling the secondary battery and the charging circuit unit;
a first air passage extending from the communication port to the discharge port; and
a second air passage extending from the intake port to the discharge port, the second air passage being independent from the first air passage such that air passing through the first air passage does not mix with air passing through the second air passage, the secondary battery being cooled by air flowing from the inlet port to the discharge port through the outlet port and the communication port in a state where the battery pack is connected to the connecting part, the charging circuit unit being cooled by air flowing from the intake port to the discharge port.

11. The battery charger as claimed in claim 10, further comprising a duct extending from the communication port to the fan, the first air passage being defined by the duct.

12. The battery charger as claimed in claim 11, wherein the housing includes a rib part and a closing member configured to be attached to the rib part, the duct being defined by the housing, the rib part, and the closing member being attached to the rib part.

13. The battery charger as claimed in claim 11, wherein the fan is disposed in both the first air passage and the second air passage.

14. The battery charger as claimed in claim 11, wherein the fan is configured to rotate such that air is drawn through the intake port and the inlet port and is discharged through the discharge port, the air flowing in a flowing direction,
wherein the fan is disposed downstream of the charging circuit unit in the flowing direction and adjacent to the discharge port.

15. The battery charger as claimed in claim 11, wherein the fan is disposed opposite to the intake port with respect to the charging circuit unit.

16. The battery charger as claimed in claim 11, wherein the communication port is formed at an upper portion of the duct,
wherein the housing is formed with a drainage port through which water droplets that has entered the housing through the communication port are drained out, the drainage port being formed at a position offset from the charging circuit unit,
wherein the duct includes a guide part configured to guide the water droplets to the drainage port.

17. The battery charger as claimed in claim 16, wherein the guide part includes an inclining portion provided at a position facing the communication port, the inclining portion being configured to guide the water droplets to the drainage port.

* * * * *